United States Patent [19]

Martin

[11] 4,373,470
[45] Feb. 15, 1983

[54] MASK POSITIONING CARRIAGE ASSEMBLY

[75] Inventor: Richard T. Martin, Goleta, Calif.

[73] Assignee: Applied Magnetics Corporation, Goleta, Calif.

[21] Appl. No.: 232,842

[22] Filed: Feb. 9, 1981

[51] Int. Cl.³ .............................................. C23C 13/08
[52] U.S. Cl. .................................... 118/720; 118/721; 118/729; 118/504; 427/282
[58] Field of Search ............... 118/715, 720, 721, 729, 118/504, 505; 204/298, 192 M; 427/282

[56] References Cited

U.S. PATENT DOCUMENTS

| | | | |
|---|---|---|---|
| 3,302,609 | 2/1967 | Walker et al. | 118/721 |
| 3,703,881 | 11/1972 | Ruf et al. | 118/720 X |
| 3,747,558 | 7/1973 | Harel | 118/721 X |
| 4,096,821 | 6/1978 | Greeneich et al. | 118/720 X |

OTHER PUBLICATIONS

De Palma, "Pico Chip Passive RF Components Inductors-Capacitors-Resistors", r.f. Design, a Cardiff Publication, Jun. 1980, pp. 11-17.

Primary Examiner—John D. Smith
Assistant Examiner—Bernard F. Plantz
Attorney, Agent, or Firm—Daniel J. Meaney, Jr.

[57] ABSTRACT

A carriage assembly for positioning a selected mask from a plurality of masks between a substrate and a source wherein an elongated mask support means having an elongated mask supporting frame and including means for defining elements for guiding and supporting the elongated mask supporting frame, a plurality of apertures formed in the elongated mask supporting frame and which extends from the upper surface to the lower surface and wherein each aperture has a predetermined diameter and a preselected spacing between the centers thereof and which support a plurality of masks therein, a support roller having a bearing surface for engaging, guiding and dynamically supporting the elongated mask supporting frame through the guiding and supporting elements; a pair of central guide rollers each of which have an outer grooved recessed receiving surface for engaging, guiding and dynamically supporting the elongated mask supporting frame through the guiding and supporting elements and a loaded clamping roller having an outer side wall bearing surface for engaging and dynamically clamping the elongated mask supporting frame and which is in parallel alignment with the axis of the central guide rollers and permits the elongated mask supporting frame to be transported while the guiding and support elements engage the surfaces of the central guide rollers and clamping roller to provide the equivalent of a three point suspension and support system for the elongated mask support means wherein the clamping roller cooperates with the guide rollers to hold the elongated mask support means between the guide rollers and support roller is shown.

22 Claims, 12 Drawing Figures

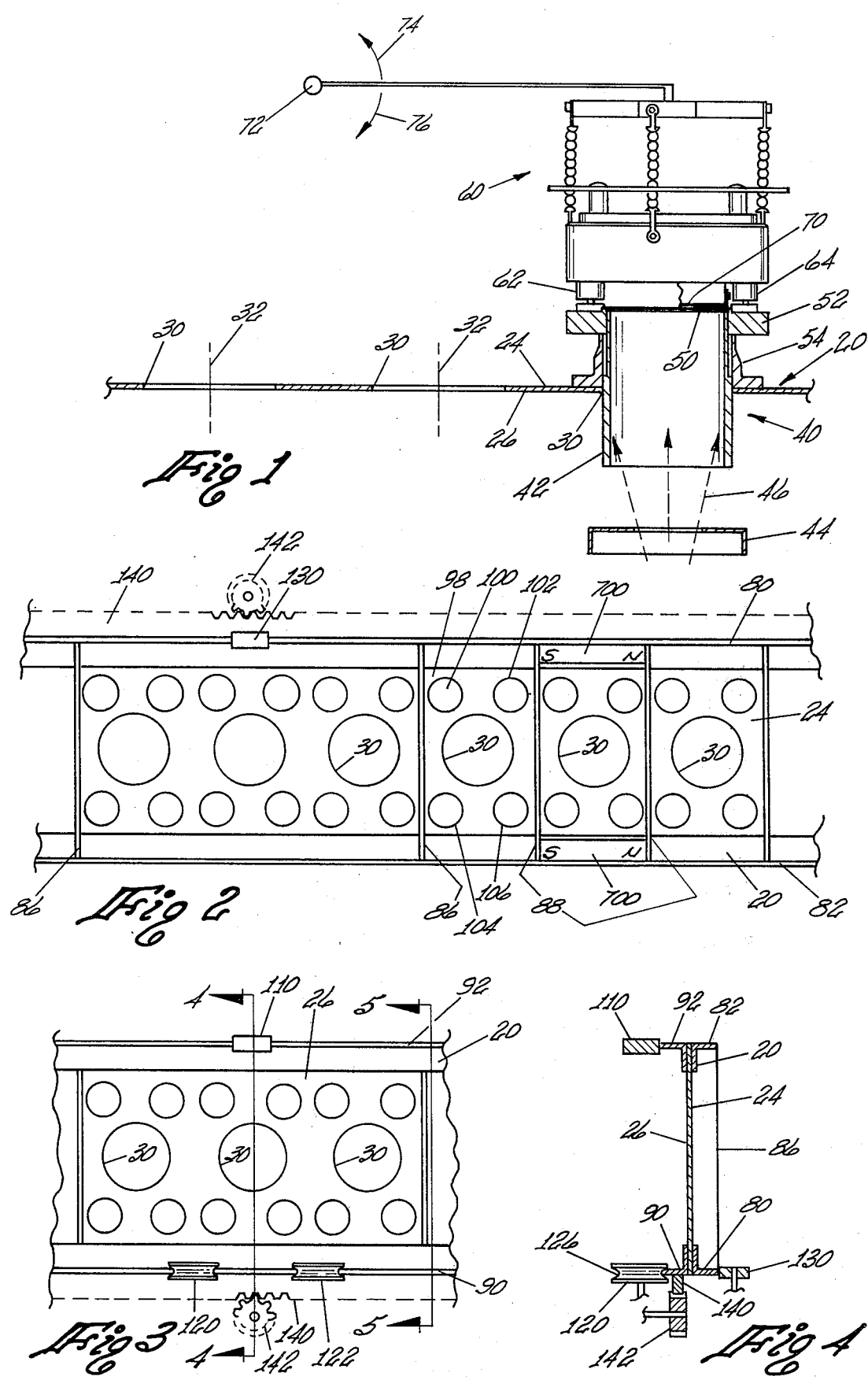

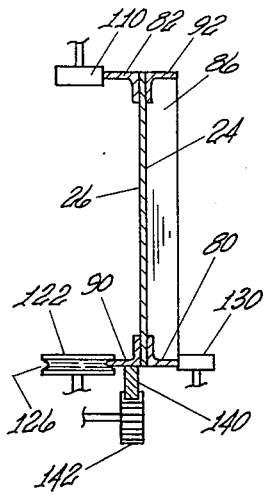
Fig 5
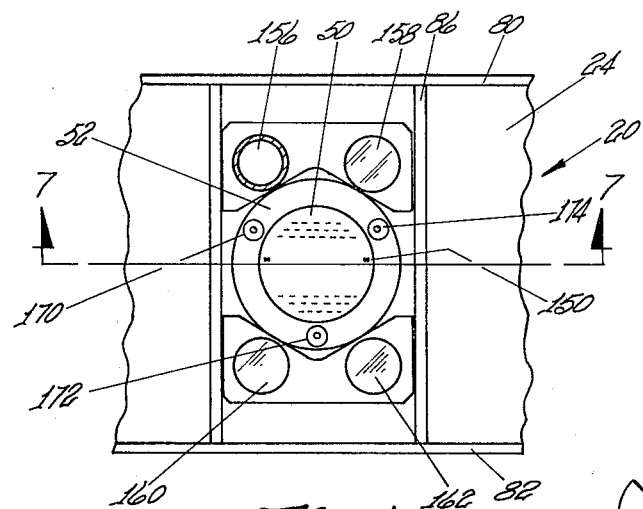
Fig 6a
Fig 6b
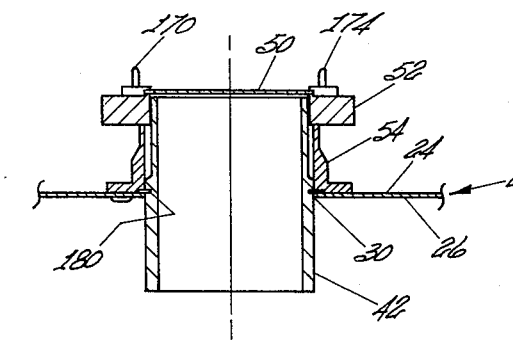
Fig 7
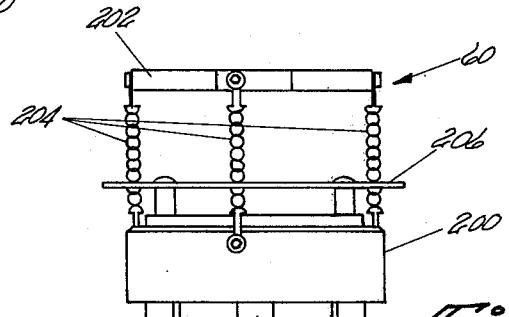
Fig 8
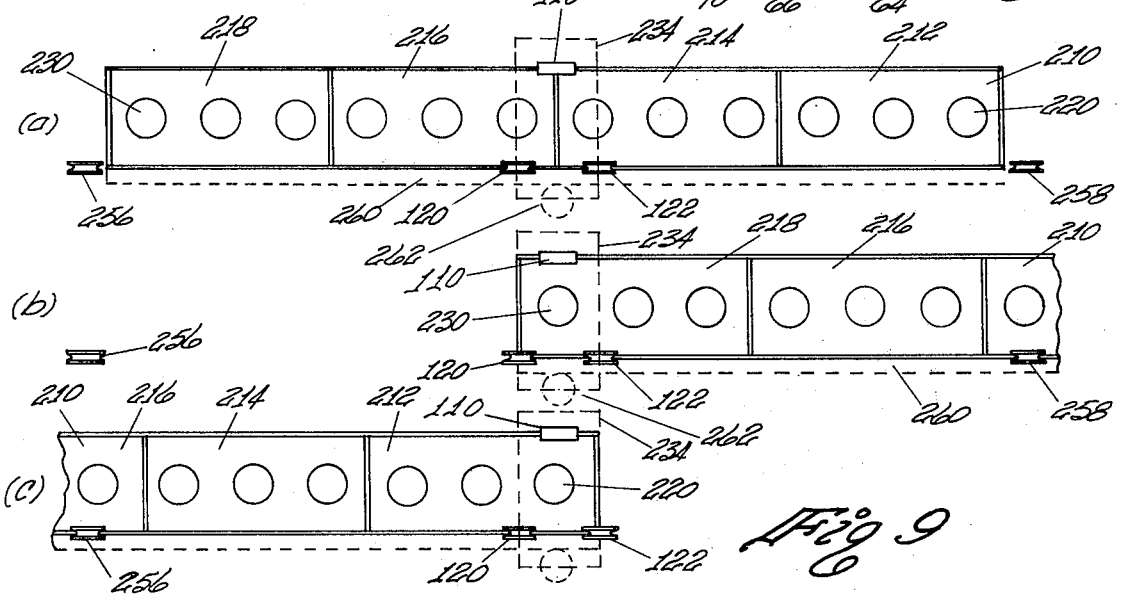
Fig 9

MASK POSITIONING CARRIAGE ASSEMBLY

BACKGROUND OF THE INVENTION

1. Field of the Invention

This invention relates to an elongated carriage support means for positioning a plurality of masks between a substrate and a source and more particularly to a carriage assembly for positioning a selected mask from a plurality of masks adapted to be supported thereon between a substrate and a source. The carriage assembly is utilized for positioning a selected mask from a plurality of masks between a substrate and a source in a vacuum deposition system.

2. Description of the Prior Art

It is known in the prior art to form thin film magnetic transducers by use of vapor deposition techniques. Examples of thin film transducers so produced are disclosed in Gibson U.S. Pat. Nos. 4,191,983 and 4,143,458, which are assigned to the assignee of the present invention.

In fabrication of thin film magnetic transducers, it is common to form a pair of magnetic pole piece layers having deposited coils forming a coil winding therebetween and the two pole pieces which may have one or more layers per pole piece, having an interim gap formed therebetween. The gap is utilized for a transducing gap adapted to be positioned adjacent a recording media. In fabrication of the pole piece layers and one or more winding layers, any one of several techniques can be used in order to precisely control the width, length, depth and registration of the various layers relative to the prior deposited and post deposited layers. Typical of a magnetic transducer formed using such technique is that disclosed in U.S. Pat. No. 3,867,868 to Lazzari.

It is also known in the art to form a multi-track thin film magnetic transducer having a plurality of vapor deposited thin film transducers formed of a pair of magnetic pole pieces and windings therebetween. Typical of such transducers are those disclosed in U.S. Pat. No. 4,092,688 to Nomura et al.

In the fabrication of the thin film magnetic transducers disclosed by the above-referenced Patents, it is known in the art to utilize a mask for controling the pattern of deposited material onto a substrate during a deposition process.

One known prior art apparatus for forming thin film magnetic transducers of a plurality of vapor deposited layers utilizes a mask support assembly having a plurality of aligned apertures each of which support a mask having a predetermined pattern formed therein. In fabrication of the thin film magnetic transducers, it is necessary to carry out the vapor deposition in a vacuum chamber and to include apparatus which is adapted to transport the mask support assembly having the mask thereon which is located between a vapor deposition source and a substrate to index the mask support assembly to position a selected mask from a plurality of masks adjacent a substrate and between the source and the substrate and to precisely and accurately register the so indexed mask to the substrate. In fabricating thin film magnetic transducers, it is necessary that accurate registration occur between the mask and the substrate so that proper registration and positioning of the deposited layer can be precisely established and controlled.

Other known techniques for fabricating thin film magnetic transducers include applying layers of preselected materials onto a substrate by use of known vacuum deposition, sputtering, plating, or chemical vapor deposition and then to selectively remove portions of the so formed layer by use of photo-etching techniques. In use of photo-etching techniques, the photo-resist material is coated onto the metallic thin film formed on the substrate through vapor deposition or plating processes. The photo-resist material is developed to form a photo-resist with a predetermined pattern wherein portions of the thin film layer to be removed are exposed and subjected to a chemical etching solution resulting in each layer of material in the thin film produced transducer having a preselected length, width, and depth in geometrical shape as determined by the photo-resist pattern formed thereon. One such method is disclosed in U.S. Pat. No. 3,891,995 to Hanazono et al.

A variation of this use of a photo-resist layer may include applying a layer of photo-resist material onto a substrate and forming apertures through the layer corresponding to areas to be plated. If an electroplating process is to be used, a layer of conductive material underlies the photo-resist layer and is used as a cathode in the plating process. If an electroless plating process is used, the layer of conductive material may be eliminated.

Another known technique for forming a thin film magnetic transducer is disclosed in U.S. Pat. No. 3,766,640 to Hahn. It utilizes magnetically permeable foil having grooves and a predetermined pattern formed therein which is adapted to receive deposited insulator and conductor material therein and which results in the foil member acting as both a portion of the magnetic transducer and as a pattern which determines the geometrical shape, width, and depth of the deposited layers.

Another known technique utilizes plating through a mask with a conductive material to form plated layers of magnetic insulating and conductive materials which define a plated layer magnetic transducer.

SUMMARY OF THE INVENTION

This invention relates to a new, novel and unique carriage assembly which is adapted for positioning a selected mask from a plurality of masks adapted to be supported on a carriage assembly between a substrate and a vapor deposition source.

In the preferred embodiment, the carriage assembly includes an elongated mask support assembly which includes an elongated mask supporting frame. Means are provided for defining supporting and guiding elements on the elongated mask supporting frame.

In the preferred embodiment, the guiding and supporting elements include a pair of spaced, parallel, generally elongated support rails which are located and extend along the periphery of the lower surface of the elongated mask supporting frame. Also, in the preferred embodiment, the means for defining the support surface includes a pair of spaced, parallel, generally elongated side walls extending along the periphery of the surface of the elongated mask supporting frame defining a mask supporting means and which are in opposed alignment with the elongated support rails.

The elongated mask supporting frame includes a plurality of apertures which extend through the upper surface to the lower surface. Each aperture has a predetermined diameter and has a predetermined spacing between the centers thereof. Each of the apertures within the elongated mask supporting frame is adapted to have a mask positioned therein.

Means for supporting the elongated mask supporting frame are provided. In the preferred embodiment, a support roller having an outer cylindrical rail bearing surface is adapted to engage and dynamically support one of the pair of rails on the mask support assembly which defines the support element. The support roller rotates about an axis which is substantially normal to the direction of elongation of the elongated mask supporting frame. In the preferred embodiment, the support roller has a selected axial length and the outer cylindrical rail bearing surface has a width which is at least equal to the width of the rail surface and any thermal expansion of the width of the carriage.

Means for guiding the elongated mask supporting frame are provided. In the preferred embodiment, a pair of central guide rollers, each of which have an outer grooved, recessed rail bearing surface, engage, guide and dynamically support the other of the pair of rails which define the guiding elements. Each of the central guide rollers rotates about an axis which is substantially normal to the direction of elongation of the elongated mask supporting frame and the central guide rollers are positioned parallel to and equidistantly one on each side of and in alignment with the axis of the support roller. Each of the outer grooved recessed rail bearing surfaces of each central guide roller is adapted to rotatably engage the other of the pair of rails to maintain the same in a fixed position within the recessed groove during conveyance of the elongated mask support assembly.

When the elongated mask support assembly is transported relative to the pair of central guide rollers and the center of gravity of the elongated mask support assembly is located between the central guide rollers, the elongated mask supporting frame will be supported an equivalent three point suspension and support defined by the outer cylindrical rail bearing surface of the support roller and the outer grooved, recessed rail bearing surface of the central guide rollers. However, if the center of gravity of the elongated mask support assembly is located beyond either of the central guide rollers, the three point suspension and support would be lost and the elongated mask supporting frame could tilt off of one of the central guide rollers.

In order to provide an equivalent three point suspension and support system, one or both of the following means for inhibiting separation of the elongated mask supporting frame from the supporting means and guiding means may be used.

One such separation inhibiting means may be a second set of remotely located guide rollers, which preferably are of similar construction to the pair of central guide rollers and are positioned one on each side of the pair of central guide rollers. The space between each central guide roller and its adjacent remote guide roller is selected such that when the elongated mask supporting frame is positioned with the center of gravity thereof between the pair of central guide rollers and in substantial alignment with the center axis of the support roller, the ends of the elongated mask supporting frame are located off of the remote guide rollers and when the elongated mask supporting frame is transported in either direction relative to the pair of central guide rollers, the remote guide roller located in the direction of movement will engage the end of the elongated mask supporting frame. Thus, when the center of gravity of the elongated mask supporting frame is located beyond the central guide rollers, the remote guide roller cooperates with one or more of the central guide rollers and the support roller to provide the equivalent three point suspension and support to prevent the elongated mask supporting frame from tilting off of the central guide rollers.

In the alternative, the separation inhibiting means may be a loaded clamping roller having an outer cylindrical side wall bearing surface adapted to engage and dynamically clamp the elongated mask support assembly as it is conveyed along a path which is substantially parallel to the direction of elongation of the elongated mask supporting frame. The clamping roller is adpated to rotate about an axis which is substantially normal to the direction of elongation of the elongated mask supporting frame. The axis of the clamping roller is positioned in parallel alignment with the axis of the central guide rollers and is located intermediate the axes of the guide rollers in the bottom view of FIG. 3. The clamping roller engages the elongated mask supporting frame on a different surface parallel to the supporting and guiding elements with the elongated mask supporting frame riding in the recessed groove formed in the periphery of each of the guide rollers. The clamping roller engages and holds the elongated mask support assembly in position with the guiding element within the recessed groove to inhibit separation or tilting of the elongated mask supporting frame from the central guide rollers during conveyance of the elongated mask supporting frame relative to the central guide rollers.

In operation, the support roller and the central guide rollers provide the equivalent to a three point suspension and support for the mask support assembly as the same is conveyed along the direction of its elongation. The clamping roller cooperates with the central guide rollers to hold the guiding element of the elongated mask support assembly within the recessed groove of each of the guide rollers while affording the supporting element of the elongated mask supporting frame the freedom to move laterally on the cylindrical rail bearing surface of the support roller during conveyance of the mask support assembly.

In the preferred embodiment, the remote guide rollers and the loaded clamping roller are utilized for redundancy. However, only one of the separation inhibiting means is required for operation to maintain the supporting surface and the guiding surface in moveable engagement with the supporting means and guiding means respectively.

In use, the carriage assembly of the present invention provides a unique and novel means for indexing the carriage assembly such that a selected mask of a plurality of masks can be positioned at a working station and in the preferred embodiment, between a source of vapor deposition material and a substrate such that vapor deposition occurs of the vapor material though the mask onto the substrate. Further, as the elongated mask support assembly is subjected to high temperatures, it essentially grows in length and width due to thermal expansion and experiences warping, bending and the like. However, the transporting means, guiding means and support means are capable of accurately indexing a mask to a working station independent of the elongated mask supporting frame dimensions which vary in response to variations in ambient temperature, stress and the like and without binding and scraping which could otherwise occur from these variations.

The present invention overcomes several of the disadvantages of prior apparatus and methods. In known prior art methods for forming thin film transducers using vapor deposition, a carriage mask support assembly was designed to transport a plurality of masks along a predetermined path relative to a working station in order to precisely position a selected mask from a plurality of masks to a substrate at a working station which, in the preferred embodiment, is a vapor deposition stage. Typically, a known carriage mask support assembly, when exposed to high temperatures such as that in a vacuum deposition process undergo dimensional changes due to thermal expansion, warping and distortions of the carriage mask support assembly. In the known prior art apparatus, the masks were clamped to a carriage mask support assembly by means of fasteners. The carriage mask support assembly performed the functions of both indexing a mask to the work area and concurrently attempted to precisely position the selected mask to a substrate. When the mask and carriage mask support assembly were exposed to the varying thermal environment, at thermal conditions normally experienced in a vapor deposition process, both the mask and carriage mask support assembly expanded and contracted during the process. In the prior art apparatus, the changes in dimension due to such expansion and contraction, warping and distortion were uncompensated for during the indexing and precisely positioning process. Thus, in a multi-step process where a plurality of masks had to be accurately positioned to a substrate, it was necessary that the temperature of the mask and carriage mask support assembly be held at a constant temperature. In use, the temperature of the mask and the carriage mask support assembly and the substrate support assembly varied due to variation in the thermal environment during the process causing variation in dimension between the mask, carriage mask support assembly and its relationship to the substrate thereby inducing misregistration between the masks relative to the substrate and the layers deposited on the substrate.

Therefore, the known prior art apparatus lacks means to precisely register the carriage-mask support assembly to a substrate in order to obtain precise mask alignment between a selected mask and a substrate. By use of the teachings of the present invention which overcomes the prior art apparatus inability to precisely index a selected mask to a substrate in a vapor deposition process with varying thermal environment conditions, layers of selected material can be deposited by vapor deposition in a precise location on the substrate in a multi-step process in varying thermal environment conditions.

An advantage of the present invention is that distortion caused by thermal expansion, contraction, warping, bending or the like of a carriage assembly due to varying thermal environment conditions will affect only the coarse indexing of a selected mask to a substrate at a working station and its adverse effects on precise registration of a mask to a substrate are eliminated.

In the known prior art apparatus for positioning a mask in a deposition work stage, the carriage assembly undergoes constant expansion, contraction and warpage due to variation in temperature which occurs principally during the heating and cooling of the mask support assembly.

In order to minimize the effects of contraction, expansion and warpage of a mask, the prior art apparatus utilized fastening means to fixedly attach the mask to a carriage in order to obtain accurate registration of the mask to a substrate at a working station. However, mask misregistration still occurred due to variation in the coefficient of expansion between the mask and base. Even if the mask and carriage were of the same material, the mass, thickness and difference in geometrical dimension, temperature gradients and shape resulted in malfunction or inadequate performance of the mask registration system.

One advantage of the present invention is that the carriage assembly performs the function of indexing a mask to a working station and the effects of contraction, expansion and warpage of the elongated mask supporting frame do not effect either the function of indexing and registration.

Another advantage of the present invention is that the carriage assembly includes an elongated supporting frame for supporting a plurality of masks in aligned parallel relationship wherein the variation in distance between the centers of each mask due to thermal expansion do not affect the indexing of the elongated mask supporting frame relative to a substrate located at a working station.

Still another advantage of the present invention is that the elongated mask supporting frame, which forms a part of the elongated mask support assembly, can have nonlinear or non-uniform thermal expansion in both its length and width and still be indexed to any selected mask along the entire length of the carriage assembly such that the selected mask is indexed to a substrate or working station independent of the thermal expansion of the elongated mask supporting frame.

Yet another advantage of the present invention is that an equivalent three point suspension and support system can be maintained by use of a separation inhibiting means which functions to maintain the supporting element of the elongated mask supporting frame in moveable supporting engagement with the supporting means and the guiding elements of the elongated mask supporting frame in moveable guiding engagement with the guiding means independent of the position of the elongated mask supporting frame relative to the substrate or working station.

Yet another advantage of the present invention is that a loaded clamping roller may be used in cooperation with the pair of spaced, grooved central guide rollers to maintain one edge of the elongated mask support assembly along a line of reference defined by the grooved central guide rollers such that any expansion in width or length occurs relative to the line of reference and will not affect the means for indexing the carriage assembly.

Still yet another advantage of the present invention is that a pair of remote guide rolers may be used in cooperation with the pair of spaced, grooved central guide rollers to maintain one edge of the elongated mask support assembly along a line of reference defined by the grooved, central guide rollers such that any expansion in width or length occurs relative to the line of reference and will not affect the means for indexing the carriage assembly.

A still yet another advantage of the present invention is that the elongated mask supporting frame is adapted to cooperate with a translatably supported tooth rack which in the preferred embodiment is located along the outer surface of one of the pair of rails. The translatably supported tooth rack is selected to have a coefficient of expansion which is substantially equal to that of the elongated mask supporting frame such that the number of teeth on the tooth rack located between the center lines of each aperture remains the same. Likewise, the number of teeth on the periphery of the coupling gear remains the same and the ratio of teeth on the tooth rack relative to the number of teeth on the periphery of the coupling gear remains the same even though the meshing capability therebetween varies as a function of temperature. As such, the translatably supported tooth rack cooperates with the coupling gear such that rotation of the coupling gear causes the teeth formed in the periphery thereof to engage and selectively transport the tooth rack and the elongated mask supporting frame a distance determined by the number of rotations of the coupling gear.

Even though the actual distance between the apertures varies due to temperature variations a predetermined rotation of the coupling gear will always move the elongated mask supporting frame the same number of aperture spacings. By establishing a preselected ratio of number of teeth on the coupling gear relative to the number of teeth located on the tooth rack between adjacent aperture positions on the elongated mask supporting frame, an integral relationship can be established between an integer number of turns of the coupling gear and an integer number of aperture positions that are transported past the working station.

A further advantage of the present invention is that precise registration of a substrate can be performed to each selected mask indexed to the working station by a separate registration means such that the positioning of a mask relative to the substrate or working station is accomplished by indexing the carriage assembly such that a selected mask is located at a working station and accurate registration of a substrate to the so indexed mask can be obtained by alignment of the substrate relative to the specific selected mask.

A yet further advantage of the present invention is that a plurality of masks can be positioned in a programmed manner within each of the apertures and any selected mask can be indexed to the working station by controlling the number of rotations and the direction of rotation of a coupling gear resulting in a selected mask being indexed to the working station at approximately the location of the substrate and thereafter, the substrate is then precisely aligned to the so-indexed selected mask to form a close, desired registration therewith.

A still yet further advantage of the present invention is that the teachings hereof can be utilized to fabricate any number of devices or components such as, without limitation, thin film magnetic transducers, thin film resistors, thin film capacitors, integrated circuits and the like.

A yet still further advantage of the present invention is that the coupling gear which forms part of the transporting means is located between the central guide rollers in opposed alignment with the working station to insure that the lateral center line of the mask will be indexed substantially at the lateral center line of the working station regardless of the dimensional variation in length of the elongated mask supporting frame due to the thermal expansion and contraction. As a result thereof, thermally induced longitudinal variations in the length of the carriage assembly and indexing errors resulting therefrom are eliminated during indexing of the mask to the working station, gantry and substrate.

BRIEF DESCRIPTION OF THE DRAWING

The foregoing and other advantages and features of this invention will become apparent from the following description of the preferred embodiment, when considered together with the illustrations and the accompanying drawing which includes the following Figures:

FIG. 1 is a plan side view partially in schematic, showing the floor of the carriage means which includes the carriage assembly, means for supporting a mask within an aperture of the elongated mask supporting frame and means in the form of a gantry for accurately registering a substrate to an indexed selected mask positioned at a working station;

FIG. 2 is a top plan view showing an elongated mask supporting frame, the apertures formed therein and the translatably supported tooth rack and coupling gear for driving the elongated mask supporting frame including magnets for specific applications;

FIG. 3 is a bottom plan view showing three apertures having a predetermined diameter and a preselected spacing between the centers thereof and wherein a pair of central guide rollers and a support roller for providing the equivalent of a three point center support and suspension is shown;

FIG. 4 is a sectional end view of the elongated mask supporting frame taken along section lines 4—4 of FIG. 3;

FIG. 5 is an end sectional view of the elongated mask supporting frame taken along section lines 5—5 of FIG. 3;

FIG. 6(a) is a partial top plan view of one aperture within the elongated mask supporting frame having a mask supported therein;

FIG. 6(b) is a pictorial representation of an alignment target illustrated in FIG. 6(a) to afford precise alignment between selected masks;

FIG. 7 is a partial front sectional plan view of an elongated mask supporting frame having a selected mask and a shield tube mounted therein;

FIG. 8 is a front plan view of that portion of the means located on a gantry for accurately registering a substrate relative to an indexed mask;

FIGS. 9(a), (b) and (c) illustrate diagrammatically a mask support assembly having a plurality of apertures which are adapted to support masks, a single support roller; two pair of guide rollers and a means for driving the elongated mask supporting frame along a path which is substantially parallel to the direction of elongation thereof and wherein FIG. 9(a) shows the elongated mask supporting frame in a center position; FIG. 9(b) shows the same in the far right position; and FIG. 9(c) shows the same in the far left position, respectively;

DESCRIPTION OF THE PREFERRED EMBODIMENT

Figure 10:
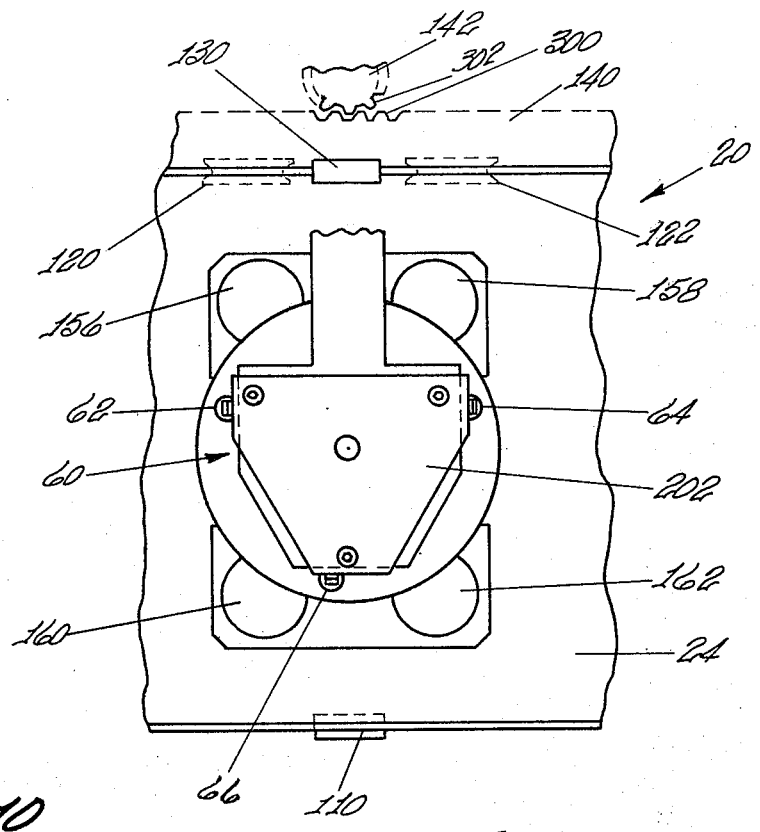
FIG. 10 is a partial top plan view of the means for accurately registering a substrate to a mask located in an aperture which is selectively positioned in the work station.

FIG. 1 discloses a means for supporting one mask from a plurality of masks relative to a work station. In its broadest aspects, the supporting means includes a carriage assembly which includes a means comprising an elongated mask support means such as an elongated mask supporting frame 20 having an upper surface 24 and a lower surface 26. The elongated mask supporting frame 20 includes means for defining a plurality of apertures 30 which extend to the upper surface 24 and the lower surface 26. Each aperture 30 has a predetermined diameter and a preselected spacing between the centers 32 of each aperture. Each of the apertures 30 can be adapted to have a mask positioned therein as illustrated at work station 40. This structure is generally referred to as means adapted for positioning each of the masks in a predetermined position relative to each other. The longitudinal axis of the elongated mask supporting frame is in the direction thereof. This lateral axis of the elongated mask supporting frame is in a direction perpendicular to the longitudinal axis and in a plane parallel to the plane of the aperture defined by the elongated mask supporting frame.

In the preferred embodiment, aperture 30 at work station 40 has a vapor deposition tube member 42 having one end thereof which is positioned relative to a source 44. In the preferred embodiment, source 44 is a source of vapor deposition material which emanates from the source 44 along the path indicated by dashed Arrows 46. The vapor deposition passes through the mask shield 42 and a mask 50 which is supported by a mask support assembly 52. The elongated mask supporting frame includes a mask supporting housing 54 for fixedly securing the vapor deposition tube member 42 and the mask support assembly 52 having the mask therein such that indexing of the mask 50 to the work station positions the mask in substantial alignment with the source 44.

After the elongated mask supporting frame 20 indexes mask 50 at the work station, a means for accurately registering a substrate, shown generally as gantry assembly 60, and which includes alignment means 62 and 64 accurately registers substrate 70 located on the gantry support means 60 relative to the mask 50.

As illustrated in FIG. 1, the gantry means for registering the substrate relative to the mask assembly and mask 50 is in an operative position. However, the gantry means is adapted to be rotated about pivot point 72 in a counter clockwise direction as shown by dashed arrow 74 to raise and withdraw the substrate 70 from its position in accurate registration with the mask 50. Of course, other means may be used to withdraw the gantry with the substrate from the mask.

With the gantry means in the raised position, the elongated mask supporting frame 20 is then driven to transport a different mask, which may have any selective pattern, into the working station 40. After a different mask is indexed to the work station 40, the gantry registration means 60 is then rotated in a clockwise direction shown by dashed arrow 76 causing the registration means 62 and 64 of the gantry means to accurately register the substrate 70 relative to a different mask then positioned at the work station. The registration means may be any appropriate mechanism to insure alignment between the gantry and mask. In the preferred embodiment, a pin and pin receiving socket is utilized.

FIG. 2 shows one embodiment of a means for selectively indexing one mask from a plurality of masks relative to a work station. The carriage assembly illustrated in FIG. 2 includes elongated mask supporting frame 20 having an upper surface 24 and a lower surface 26 which is shown in greater detail in FIGS. 4 and 5.

In the broadest aspect, the elongated mask support means includes means for defining a guiding element and supporting element for the elongated mask support means. In the preferred embodiment, the elongated mask supporting frame has means defining a guiding element and supporting element in the form of a pair of spaced parallel generally elongated support rails 90 and 92 which are located and extend along the periphery of the lower surface of the elongated mask supporting frame 20.

The elongated mask supporting frame 20 includes means for defining the pluralities of apertures 30 which are adapted to receive a mask assembly positioned therein. The apertures 30 extend through the upper surface to the lower surface of the elongated mask supporting frame 20. In FIG. 2, the elongated mask supporting frame is shown to have cross members 86 which may be applied hereto to provide additional structural rigidity to the elongated mask supporting frame 20.

The elongated mask supporting frame 20 includes means for defining a mask supporting surface, which in the preferred embodiment, is in the form of a pair of spaced, parallel, generally elongated side walls 80 and 82 extending along the periphery of the surface of the elongated mask supporting frame 20 defining a mask supporting means. The side walls 80 and 82 are in opposed alignment with the elongated support rails 90 and 92.

In addition to the mask receiving apertures 30, each mask position has in the preferred embodiment, four monitoring tube apertures 100, 102, 104 and 106 which are illustrated for mask position 98.

FIG. 3 illustrates the elongated mask supporting frame with an aperture for a mask indexed to a working station. In the bottom view of FIG. 3 is illustrated also a pair of central guide rollers 120 and 122, each of which have an outer grooved recessed rail receiving surface illustrated as grooved recessed rail receiving surface 126 in FIG. 4. The central guide rollers 120 and 122 are adapted to engage, guide and dynamically support the rail 90 of the pair of rails as the elongated mask supporting frame 20 is conveyed along a path which is substantially parallel to the direction of elongation thereof. Each of the central guide rollers 120 and 122 are adapted to rotate about an axis which is substantially normal to the direction of elongation of the elongated mask supporting frame 20 and each of which are parallel to and in alignment with the axis of a support roller 110. In the preferred embodiment, the axes of the central guide rollers are positioned equidistantly one on each side of the axis of the support roller 110. Each of the guide rollers 120 and 122 are adapted to have the grooved recessed rail receiving surface 126 as illustrated in FIG. 4, which is adapted to rotatably engage the rail 90 which is the other of the pair of rails, to maintain the same in a fixed position within the recessed groove 126 during conveyance of the elongated mask supporting frame.

Referring again to FIG. 3, a support roller 110 having an outer cylindrical roller bearing surface and a selected axial length is adapted to engage and dynamically rotatably support one of the pair of rails such as rail 92 in order to support the mask support assembly in the elongated mask supporting frame 20 as it is conveyed along a path which is substantially parallel to the direction of elongation of the elongated mask supporting frame 20. Support roller 110 defines a means for supporting the elongated mask supporting frame 20, through a means for defining a supporting element such as rail 92. In use, the support roller 110 is adapted to rotate about an axis which is substantially normal to the direction of elongation of the elongated mask supporting frame 20. The support roller 110 outer rail bearing surface must have a width to accommodate the lateral thermal expansion of the elongated mask supporting frame, e.g., the outer cylindrical rail bearing surface has a width parallel to the elongated mask supporting frame which is at least equal to the width of the rail 92 carried thereby plus any variations in the elongated mask supporting frame due to thermal expansion and contraction. In essence, the edge of rail 92 engages the outer cylindrical rail bearing surface which is in parallel alignment with the support roller axis.

As noted herein, at least one of the movably engaging means or the means defining a guiding element includes a recessed groove and the other includes a protruding lip. In the preferred embodiment, the protruding lip is located on the elongated mask supporting frame and the recessed groove on the central guide roller. However, the recessed groove could be located on the elongated mask supporting frame and the protruding lip on the surface of the central guide roller. Either variation thereof may be used in practicing this invention.

As illustrated in FIG. 3, with the elongated mask supporting frame in a center position, the central guide rollers 120 and 122 and the support roller 110 provide the equivalent of a three point suspension and support. As the elongated mask supporting frame 20 is exposed to a thermal environment, as experienced in a vapor deposition process, the length and width thereof will increase due to thermal expansion. The rail 90 is essentially confined by the outer grooved recessed rail receiving surface 126 of each central guide roller 120 and 122 such that movement thereof is along the line of reference. This variation in width of the elongated mask supporting frame 20 results in rail 92 moving laterally along the outer cylindrical rail bearing surface of support roller 110.

Variations in length of the elongated mask supporting frame are accommodated by rail 90 moving relative to the outer, grooved recessed rail receiving surface of each central guide roller 120 and 122.

As shown in FIG. 3, the elongated mask supporting frame 20 is supported by support roller 110 and central guide rollers 120 and 122. One example thereof is shown in greater detail in FIG. 9(a) when the elongated mask supporting frame is in centered position. When the elongated mask supporting frame is off center position, the elongated mask supporting frame engages and is supported by remote guide rollers 256 and 258 as illustrated in FIGS. 9(b) and 9(c).

When the center of gravity of the elongated mask supporting frame is located within a stabilized triangular area formed by the rail contact points in support roller 110 and central guide rollers 120 and 122, the equivalent three point suspension and support is provided by support roller 110 and central guide rollers 120 and 122. When the center of gravity is located at positions other than within the above described stabilized triangular area, the equivalent three point suspension and support is provided by the support roller 110 and by at least one centered guide roller 120 or 122 and one remote guide roller 256 or 258. This is discussed in greater detail in connection with FIGS. 9(a), 9(b), and 9(c). The effect of the relationship between the support roller 110 of FIG. 3 and the central guide rollers 120 and 122 is to form an equivalent three point suspension and support which concurrently holds the elongated mask supporting frame 20 in position relative to a fixed reference line essentially independent of the variations in physical characteristics while affording transportation of the same. One inherent relationship exists in the equivalent three point suspension and support system, that is, the center of gravity of the elongated mask supporting frame must be maintained within the area defined by the stabilized triangular area between the center lines of the axes of the central guide rollers 120 and 122, otherwise the elongated mask supporting frame 20 will tilt off of the three point suspension system.

In order to prevent or inhibit the above, a means for inhibiting separation of the elongated mask supporting frame 20 from the supporting means, the support roller 110, and the guide means, e.g. the central guide rollers 120 and 122 is needed.

One such separation inhibiting means may be a second set of remotely located guide rollers such as remote guide rollers 256 and 258 illustrated in FIG. 9. The construction of the remote guide rollers 256 and 258 are similar to the pair of central guide rollers 120 and 122 and are positioned one on each side of and in alignment with the pair of central guide rollers 120 and 122. When the elongated mask supporting frame 20 is in its centered position the remote guide rollers 256 and 258 as illustrated in FIG. 9(a) are positioned just off the ends of the elongated mask supporting frame 20.

When the elongated mask supporting frame 20 is transported in either direction relative to the pair of central guide rollers 120 and 122, the remote guide rollers 256 or 258 located in the direction of movement will engage the end of the elongated mask supporting frame 20. As the center of gravity of the elongated mask supporting frame 20 shifts to a position between one of the central guide rollers 120 or 122 and one of the remote guide rollers 256 or 258, and equivalent three point suspension and support system is developed between one or both of the central guide rollers 120 or 122, one of the remote guide rollers 256 or 258 and the support roller 110. Thus, at any transposed position and independent of the length, width, or distortion of the elongated mask supporting frame 20, a three point suspension and support exists to prevent the elongated mask supporting frame from falling off of the rollers while being referenced to a reference line which extends through the grooved edges of all of the central guide rollers 120 and 122 and the remote guide rollers 256 and 258.

In addition to variations in width and length experienced by the elongated mask supporting frame 20, the elongated mask supporting frame 20 experiences warpage in the form of crook, bowing and twisting or combinations thereof. For purposes hereof, the term "crook" shall mean curvature of the elongated mask supporting frame about an axis which is substantially normal to a plane defined by the longitudinal and lateral axes of the elongated mask supporting frame with the curvature being located with such plane. The term "bow" shall means curvature of the elongated mask supporting frame, about an axis parallel to the lateral axis and located away from the nominal plane defined by the longitudinal and lateral axes of the elongated mask supporting frame. The term "twist" shall mean skewing of opposite edges of the elongated mask supporting frame.

When a crook type warpage occurs and one of the remote guide rollers 256 and 258 in FIG. 9(a) engage the rail 90 of the elongated mask supporting frame, rail 90 will ride upon the grooved recessed rail receiving surface 126 of the central guide roller 120 shown in FIG. 4, but the rail 90 will be held in position by the edges of the grooved recessed rail receiving surface 126. The relationship between the rail 90 and groove of central guide roller 122 would be the same except that the edge of rail 90 would engage the opposite side of the groove of the central guide roller 122.

Referring again to FIG. 2, in the alternative, the separation inhibiting means may be a loaded clamping roller.

In the preferred embodiment, a loaded clamping roller 130 having an outer cylindrical sidewall bearing surface engages and dynamically clamps the sidewall 80 illustrated in FIG. 4, as the elongated mask supporting frame 20 is conveyed along a path which is substantially parallel to the direction of elongation thereof. The loaded clamping roller 130 is adapted to rotate about an axis which is substantially normal to the direction of elongation of the elongated mask supporting frame 20. In addition, the axis of the loaded clamping roller 130 is spaced in parallel alignment with the axis of the central guide rollers 120 and 122 and is equidistant the central guide rollers of axis 120 and 122.

Referring again to FIG. 4, the central guide roller 130 is spaced from the central guide roller 120. The spacing is such that, one edge of the rail 90 of the pair of rails is located in the recessed groove 126 of the central guide roller 120 and the edge of the loaded clamping roller 130 engages the edge of one of the side walls 80 of the pair of sidewalls. The distance between the center of the recessed groove 126 and the edge of the surface of the loaded clamping roller is substantially equal to the geometrical dimension between the outer edges of rail 90 and the surface of the loaded clamping roller such that the rail edge remains in the groove. The elongated mask supporting frame 20 is held in fixed or clamped position within the recessed groove 126 to inhibit separation of the elongated mask supporting frame 20 from the guide rollers 120 and 122 during conveyance of the elongated mask supporting frame relative to the central guide rollers. Likewise, as the elongated mask supporting frame is transported relative to the remote guide rollers 256 and 258 of FIG. 9, the loaded clamping roller 130 of FIGS. 4 and 5 inhibits separation of the elongated mask supporting frame 20 from the appropriate central guide rollers 120 and 122.

Further, when the elongated mask supporting frame experiences crook type warpage, the edge of the rail 90 does not stay in the center of the recessed groove 126 but, in fact, rides upon and contacts the sloped edges of the central guide rollers 120 and 122 which define the groove. The loaded clamping roller 130 is sufficiently compliant to accommodate the variations in the elongated mask supporting frame 20 while clamping and holding the same in position as noted above. Also, when the elongated mask supporting frame 20 is supported by one central guide roller and one remote guide roller, the clamping roller 110 is sufficiently compliant to hold the rail 90 within the grooves and also permit the elongated mask supporting frame to bow while the rail 90 is still being held in the grooves.

As illustrated in FIGS. 2, 3 and 4, the support roller 110 and the central guide rollers 120 and 122 provide a three point suspension and support to moveably support the elongated mask supporting frame 20 as the same is conveyed along the direction of its elongation. The loaded clamping roller 130 cooperates with the central guide rollers 120 and 122 to hold the edge of the rail 90 within the recessed groove 126 of each of the central guide rollers 120 and 122 while enabling the edge of the rail 92 to move laterally on the outer cylindrical bearing surface of the support roller 110 during conveyance of the elongated mask supporting frame.

In the case of twist type warpage, when the elongated mask supporting frame 20 is in an off centered position, rails of the elongated mask supporting frame 20 will engage one or both of the central guide rollers 120 and 122, one of the remote guide rollers 256 and 258 and the support roller 110 in a manner similar to that enumerated in crook or bow type warpage.

Referring to FIGS. 3, 4 and 5, in the preferred embodiment the elongated mask supporting frame 20 has a translatably supported tooth rack 140 disposed along the outer surface of the rail 90 which is one of the pair of parallel rails 90 and 92. The translatably supported tooth rack 140 extends along the length of the elongated mask supporting frame between points slightly beyond the center of the two end mask positions. The translatably supported tooth rack 140 is selected to have a coefficient of thermal expansion which is substantially equal to that of the elongated mask supporting frame 20 and rail 90. The number of teeth in the tooth rack 140 located between the center line of each aperture remains the same during the expansion and contraction of the elongated mask supporting frame 20. Likewise the number of teeth on the periphery of the coupling gear 142 remain the same. Thus, the ratio of teeth in the tooth rack 140 relative to the number of teeth on the periphery of the coupling gear 142 remain the same even though the meshing capability therebetween varies as a function of temperature.

With the above construction, the engagement point between the tooth rack 140 and coupling gear 142 remains at substantially the same point and the position of the mask relative to the working station is not changed significantly and the number of aperture positions that the elongated mask supporting frame is translated is determined by the number of rotations of the coupling gear 142.

In the preferred embodiment, the coupling gear 142 is rotatably mounted with its axis substantially normal to the axis of the guide rollers 120 and 122 and extends vertically upward from and is equally spaced between the axis of the central guide rollers 120 and 122 and in spaced alignment with the axis thereof 120 and 122.

As shown in FIG. 3, the coupling gear 142 is located between the central guide rollers 120 and 122 and in opposed alignment with the working station to which the mask aperture 30 is indexed. With the coupling gear 142 so positioned, the lateral center of the mask aperture 30 will be indexed substantially at the lateral center of the working station regardless of the dimensional variation due to thermal expansion, contraction and distortion of the elongated mask supporting frame 20.

In the preferred embodiment, the coupling gear 142 is rotatably mounted so as to be engagedly disposed relative to the translatably supported tooth rack 140 such that rotation of the gear 142 causes the teeth formed in the periphery thereof to engage and selectively transport the tooth rack 140 and the elongated mask supporting frame 20 attached thereto relative to the support roller 110 and the central guide rollers 120 and 122 along the path in a direction of elongation of the elongated mask supporting frame.

In the preferred embodiment, the pitch diameter of coupling gear 142 and the number of teeth in the support tooth rack gear 140 between the apertures' centers is selected such that one revolution of rotation of the coupling gear 142 transports the elongated mask supporting frame along its path a distance equal to the distance between the center lines of two adjacent apertures 30.

FIG. 7 illustrates in greater detail the relationship between the elongated mask supporting frame 20, a mask 50 which is supported by the mask support assembly 52 and its position relative to the aperture 30 which extends from the upper surface 24 to the lower surface 26. The selected mask 50 has alignment targets 150 which are illustrated in greater detail in FIG. 6 (a) and (b). The alignment targets 150 provide a means for accurately aligning masks to each other. In FIG. 6 (a), the mask support assembly 52 includes a plurality of pins for aligning the masks to a gantry means 60 shown as 170, 172 and 174. In addition a plurality of monitoring apertures have either the monitoring shield tube such as monitoring shield tube 156 mounted therein or a plurality of cover members covering the apertures such as aperture covers 158, 160 and 162.

FIGS. 7 and 8 show details of the alignment pins located on the mask support assembly 52 and the alignment and receiving means 62, 64 and 66.

FIG. 7 shows the elongated mask supporting frame 20 having the upper surface 24 and the lower surface 26. A mask frame support housing 54 cooperates with the mask frame support 52 to support a mask 50 relative to the aperture 30 in the elongated mask supporting frame 20 and to minimize the thermal conductivity of the assembly 50 and 52 and the elongated mask supporting frame 20. Mask frame support housing 54 is attached to elongated mask support frame 20. The locking ring 180 contains shielding tube 42 between the elongated mask supporting frame 20 and mask frame support housing 54. Housing 54 provides rotational constraint of 52 through a pin and a notch arrangement. The mask frame support housing 54 supports the mask frame support 52 and the shielding tube 42 holds the mask frame support 52 concentric.

In FIG. 7, two alignment pins are illustrated, pins 170 and 174. Since FIG. 7 is a sectional view, pin 172, illustrated in FIG. 6(a) is not shown but forms a third pin for the three pin alignment system.

FIG. 8 illustrates one embodiment of a gantry means 60 for supporting a substrate relative to the mask 50. Pin receiving means 62, 66 and 64 are adapted to make mating engagement with pins 170, 172 and 174 respectively. A substrate support housing is adapted to support the substrate 70 in a secure stable position. A support platform 202 supports the substrate housing 200 through three flexible chain members 204. An intermediate plate 206 may be used as a heat shield and as a support for other components such as electrical connectors if required in the gantry means.

When the gantry means 60 as illustrated in FIG. 8 is positioned relative to the mask support assembly 52 containing aligned pins, the aligned pins cooperate with the pin receiving means to permit the housing 200 to nestle into proper alignment between the pin receiving means and the pins such that the substrate 70 is accurately registered relative to mask 50. It is desirable to have prealigned the alignment pins relative to the alignment pin receiving means in the housing to insure accurate registration between the various masks each time the gantry is positioned relative to the masks 50. The target 150 is used to establish this pin prealignment between the various masks to insure the deposited patterns from said masks have the proper registration one to another.

FIG. 9 illustrates pictorially the method for transporting the elongated mask supporting frame 210 through a plurality of various positions. FIG. 9 illustrates the elongated mask supporting frame 210 as having four sections, namely Sections 212, 214, 216 and 218. For purposes of illustration, Section 212 is shown to have one aperture 220 located at the far right end thereof and Section 218 is shown to have aperture 230 at the far left end thereof. A translatably supported tooth rack 260 is disposed along the elongated mask supporting frame in order to transport the same such that the aperture from a specific section is positioned within a work area 234. A coupling gear 262 cooperates with the translatably supported tooth rack 260 such that controlled rotation thereof drives the tooth rack 260 and subsequently the elongated mask supporting frame to selectively position a selected mask of a plurality of masks within the work area 234. In the embodiment illustrated in FIGS. 9(a), (b) and (c), the pitch diameter of the coupling gear 262 is selected such that one revolution of the coupling gear 262 transports the elongated mask supporting frame 210 a distance equal to the distance between the center lines of two adjacent apertures.

In FIG. 9(a), the elongated mask supporting frame 210 is shown in its centered position when no apertures are positioned within the work area 234. In the embodiment illustrated in FIG. 9(a), the first pair of central guide rollers 120 and 122 are positioned relative to the supporting roller 110 to completely support the elongated mask supporting frame. The elongated mask supporting frame 210 is in a stable equilibrium condition of balance at this point. A second set or remote guide rollers having grooved recesses therein are illustrated as 256 and 258 and are located relative to the coupling gear 262 and the support roller 110 such that movement of the elongated mask supporting frame 210 to the right or left of the center position as shown in FIG. 9(a) results in one of the second set of remote guide rollers 256 or 258 providing additional support for the elongated mask supporting frame 210.

FIG. 9(b) illustrates the relationship between the elongated mask supporting frame 210 when aperture 230 which is located at the left hand side of Section 218 is positioned within working area 234. Central guide rollers 120, and 122 cooperate with support roller 110 to support the aperture 230 within the work area 234. Remote guide roller 258 is positioned so that its axis is in parallel spaced alignment with the axes of central guide rollers 120 and 122 and the distance between the axis of central guide roller 122 and the axis of remote guide roller 258 is selected such that the remote guide roller 258 engages rail 90 and provides additional support when the elongated mask supporting frame 210 is moved a slight distance to the right from the center position illustrated in FIG. 9(a). The distance between the center line of a central guide roller and its adjacent remote guide roller is selected such that rail 90 does not engage its associate remote guide roller 256 or 258 when the elongated mask supporting frame is in its center position and the rail 90 is at its maximum possible length due to thermal expansion, warpage and the like.

FIG. 9(c) illustrates the elongated mask supporting frame in a position where aperture 220 which is located to the extreme right hand side of Section 212 is positioned within the work area 234.

In the position illustrated by FIG. 9(c), guide rollers 120 and 122 and support roller 110 provide support for the elongated mask supporting frame 210 in the vicinity of the work area 234. Remote guide roller 256, which is located left of central guide roller 120, has its axis in spaced parallel relationship with the axis of central guide roller 120. The spacing of the axis of remote guide roller 256 relative to the axis of the central guide roller is determined using the same criteria set forth with respect to FIG. 9(b).

As noted hereinbefore, when the elongated mask supporting frame 210 is in the position illustrated in FIGS. 9(b) and 9(c) it is subject to thermal expansion and warping. In the event that the elongated mask supporting frame 210 became so bowed and twisted that only one of the central guide rollers 120 or 122 may engage the guide rail 90 on the elongated mask supporting frame 210, a three point suspension and support is provided to the elongated mask supporting frame 210 by at least one of the central guide rollers 120 and 122, one of the remote guide rollers 256 or 258 and the support roller 110. An additional support may be provided in the form of a loaded clamping roller 130 illustrated as clamping roller 130 in FIGS. 4 and 5.

In the embodiment illustrated in 9(a), 9(b) and 9(c), the rail 90 which is located on the underside of the elongated mask supporting frame 210 is maintained in a reference line which is defined by the centers of the grooved recesses areas and each of central guide rollers 120, 122, and remote guide rollers 256 and 258, either individually or in combination. During heating of the elongated mask supporting frame, the entire frame is subject to expansion, warping or growth along the width and length thereof. Expansion of the dimension of the elongated mask supporting frame in a direction which is parallel to the axis of the guide rollers results in the rail 92 located on the side of the elongated mask supporting frame opposite to that supported by the guide rail 90 which is in contact with and rotatably supported by the outer cylindrical surface of support roller 110, moving outward on the outer cylindrical surface which does not restrain or otherwise fix the outer rail. In this manner, any warping, increase in length, or increase in width due to expansion by heating is compensated for by the carriage assembly such that when an aperture is positioned within the work area 234, the three points of support are provided therein by guide rollers 120, 122, support roller 110, and possibly guide rollers 256 or 258. When the rail 90 is engaged in remote guide roller 256 or 258 and the carriage and rail 90 has a curvature formed therein due to warpage or bending, that is in the plane of the elongated mask supporting frame 210, the rail 90 will engage one beveled side of central guide roller 120 and the other beveled side of central guide roller 122. The net result thereof is for the central guide rollers 120 and 122 to act effectively as a single guiding device with the depth of engagement (mesh) of the rack 140 and the gear 142 remaining effectivly the same as if rail 90 were straight and seated in the bottom of the grooves 126 of central guide rollers 120 and 122.

If rail 90 has curvature that lies normal to the plane of the elongated mask supporting frame 210, and the rail 90 is engaged in guide rollers 256 or 258, then only one of the central guide rollers 120 or 122 will be engaged to guide rail 90. In addition, the clamping roller 130 such as that illustrated in FIGS. 2, 4 and 5 can be used to insure that the elongated mask supporting frame is held within the grooves of the grooved central guide rollers 120 and 122. As noted herein with respect to the central guide rollers 120 and 122, the grooved surface may be located on the elongated mask supporting frame and a protruding lip may be located on the periphery of the remote guide rollers 256 and 258 as well as on the periphery of the central guide rollers 120 and 122.

FIG. 10 illustrates in greater detail an assembled gantry means 60 which is mounted on and accurately registered with a mask frame assembly 52 containing a mask 50. Alignment pin receiving means 62, 66 and 64 cooperate with the alignment pins in the mask support assembly which pins are illustrated in FIGS. 6 and 7. The elongated mask supporting frame 20 includes a translatably supported tooth rack 140 which cooperates with coupling gear 142. The translatably supported tooth rack 140 has a plurality of spaced teeth 300 located along the edge thereof which are adapted to cooperate with teeth 302 located in the periphery of coupling gear 142. As noted herein, in this embodiment, one revolution of the coupling gear 142 results in transporting the translatably supported tooth rack 140 a distance equal to the distance between two center lines of two adjacent apertures located on the elongated mask supporting frame 20. The central guide rollers 120 and 122 are dashed in to show their position relative to the clamping roller 130 and the coupling gear 142 and support roller 110 is shown with its axis perpendicular with the axis of coupling gear 142 and clamping roller 130 as shown in FIG. 4.

In FIG. 10, monitoring apertures 156, 158, 160 and 162 are illustrated to show their positions relative to the gantry means in its assembled relationship with the mask support assembly 52. In FIG. 10, the gantry means 60 is positioned in accurate registration position with a mask through the alignment pin receiving means 62, 64 and 66. The elongated mask supporting frame 20 is supported at three points by central guide rollers 120, and/or 122, and 110 together with remote guide rollers 256 or 258. The clamping roller 130 insures that elongated mask supporting frame 20 is intimately held in position thereagainst.

Figure 11:
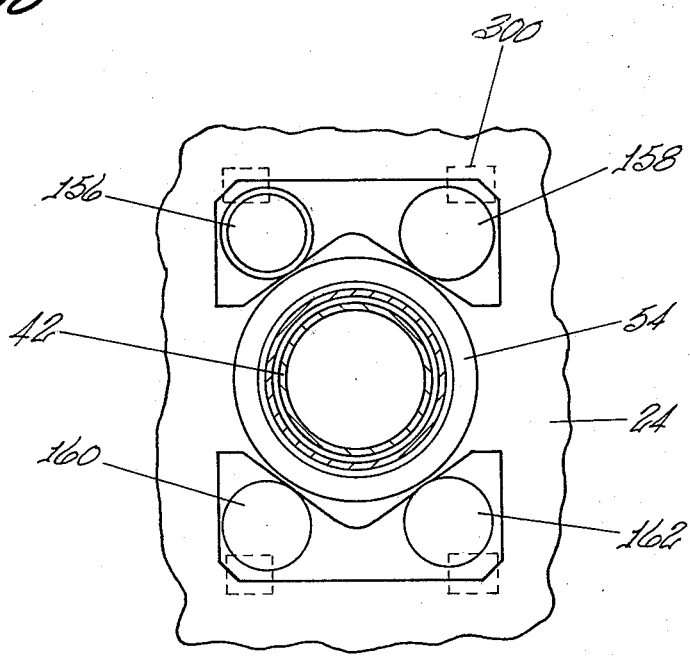
FIG. 11 is a partial top plan view partially in cross section illustrating the mounting of a mask within an aperture of an elongated mask supporting frame, a plurality of monitoring tube apertures located around the mask support aperture and means for selectively passing a portion of the vapor deposition along a selected monitoring tube.

Referring to FIG. 11, a top plan view partially in cross section shows the shielding tubes 42, the mask frame support housing 54, and the monitoring tube 156. The other three monitoring apertures 158, 160 and 162 are capped such that vapor from the vapor deposition can pass through monitoring shield tube 156 only.

By use of the monitoring tube and monitoring cap selection technique as illustrated in FIG. 11 above, the deposition thickness monitoring device can be selected as a function of selecting a specific monitoring tube in association with a specific mask position in a vapor deposition device. The monitoring devices are shown by dashed rectangles 300 and are located above the plane illustrated in FIG. 11.

In the preferred embodiment of the present invention, the carriage assembly for indexing a selected mask from a plurality of masks is adapted for use with a vapor deposition source which is located at a working station. However, it is envisioned and anticipated that the carriage assembly hereof has wide application in all types of deposition systems including, without limitation, sputtering systems, chemical vapor deposition systems, plating techniques and the like.

In addition, it is envisioned that one or more gantry means could be used so that parallel deposition of a layer onto a substrate can occur so that one or more masks and/or substrates are utilized or that one or more working areas are provided during each deposition step.

Of importance is the fact that the elongated mask supporting frame provides a means for providing a coarse indexing of an aperture, mask assembly and associated monitoring tubes relative to a source and that the precise final accurate registering is obtained by aligning the gantry means with the sustrate relative to the mask. Prior to the deposition process, it is anticipated that each of the masks would be prealigned to the gantry means such that accurate registration would occur between the gantry means and the mask at any location and when any mask is positioned within the working station.

In addition, it is possible that one or more of the layers being deposited during the vacuum deposition would be a magnetic layer which could form the magnetic circuit for a thin film magnetic device. In such event, it is desirable to preorientate the magnetic means within the magnetic material during deposition thereof. FIG. 2 illustrates that one or more sections of the elongated mask supporting frame 20 could include a set of parallel spaced aligned magnets 700 and poles 88 to provide the desired magnetic orientation in the magnetic domains. Of course, the spaced parallel aligned magnets 700 could be located selectively within any section of the elongated mask supporting frame as desired. In utility, a wide range of thin film deposited components can be fabricated using the teachings of this invention. The preferred embodiment of the present invention is to form thin film magnetic transducers which require precisely aligned pole pieces, windings, layers and the like. However, it is possible to fabricate other lesser components such as capacitors, resistors, transformers, inductors including combinations thereof and the like using the multi-step, multi-mask technique including the use of the unique carriage assembly disclosed herein.

It is also envisioned that other techniques be used to increase the reliability, registability and other effects of the mask substrate interface by providing means for stabilizing the mask, heating the mask during deposition, heating the substrate during deposition or any combination thereof in order to minimize misregistration due to the effects of thermal expansion and uncontrolled variables.

What is claimed is:

1. A carriage assembly for positioning a selected mask from a plurality of masks adapted to be supported thereon between a substrate and a source comprising
   an elongated mask support means including
      means adapted for positioning each of said masks in a predetermined position relative to each other in a selected plane;
      means defining a guiding element and a supporting element;
   means operatively coupled to and for transporting the elongated mask support means and masks supported thereby along a predetermined path and being adapted to position a selected mask at a working station between a substrate located in a plane substantially parallel to said selected plane and a source located in an opposed relation to a said substrate; and
   means positioned along said predetermined path for movably engaging at a said working station said means for defining said guiding element and for directing movement thereof along a line of reference within said predetermined path, at least one of said means for defining said guiding element and said movably engaging means including means defining a recessed groove and the other of which defines a protruding lip which movably engage said recessed groove along said line of reference, said guiding element defining means and said movably engaging means being operative to confine movement of the guiding element to movement thereof along said line of reference; and
   means for movably engaging at a said working station said means for defining said supporting element on a surface which affords unconstrained thermal expansion and contraction and distortion of said elongated mask support means in all directions including along said line of reference to minimize lateral variations in position of a said selected mask at a said working station, said transporting means being adapted to move said elongated mask support means including masks supported thereby along said predetermined path relative to a said substrate and a said source independent of unconstrained thermal expansion and contraction and distortion of said elongated mask support means while confining movement of the guiding element along said line of reference.

2. The carriage assembly of claim 1 wherein said elongated mask support means includes
   an elongated member operatively coupled to said supporting means and having a plurality of spaced teeth located along one edge thereof and substantially parallel to said predetermined path, said elongated member being formed of a material having a coefficient of thermal expansion along said line of reference substantially equal to the coefficient of thermal expansion of the material forming said support means to maintain the number of teeth between the center line of each mask substantially the same independent of the amount of thermal expansion and contraction of the elongated mask support means; and
   said transporting means includes
      a rotatable driving member positioned at a said working station having a predetermined number of teeth formed around the periphery thereof and positioned to moveably engage the teeth on said elongated member, said rotatable driving member and said elongated member being adapted to maintain driving engagement therebetween independent of the amount of thermal expansion and contraction of the elongated mask supporting means and of said elongated member along said line of reference to enable a predetermined number of turns of said rotatable driving means to transport said support means a predetermined number of mask positions along said line of reference.

3. The carriage assembly of claim 1 wherein said means for guiding and supporting said elongated supporting means include a support roller for defining said linear surface for slideably rotatably supporting said supporting means as said elongated mask supporting means is conveyed along said predetermined path; and a pair of central guide rollers for engaging, guiding and dynamically supporting said supporting means as said elongated mask supporting means is conveyed along said predetermined path which is substantially parallel to the direction of elongation of said elongated mask supporting means.

4. The carriage assembly of claim 3 wherein said pair of central guide rollers includes means for defining a recessed groove in the periphery thereof.

5. The carriage assembly of claim 3 wherein said rotatable driving member is located in opposed alignment to the position of a said mask indexed to a working station between a substrate and a source and on the lateral center line of a said working station to insure that the lateral center line of a said mask will be indexed substantially at the lateral center of a said working station regardless of the dimensional variation in length of the elongated mask supporting frame due to thermal expansion and contraction and distortion.

6. The carriage assembly of claim 5 wherein the number of teeth on the periphery of said rotatable driving member and number of teeth on the elongated member are selected such that the ratio thereby between makes an integer number of rotations of the rotating member move the carriage assembly a predetermined number of mask positions.

7. The carriage assembly of claim 3 further comprising
a pair of remote guide rollers positioned one on each side of said central guide rollers and located along said line of reference and for engaging, guiding and dynamically supporting said elongated mask supporting means when it is located at a position other than its centered position, at least one of said central guide rollers, one of said remote guide rollers and said support roller cooperating with each other to form an equivalent three point support and suspension for said elongated mask supporting means as it is transported along said predetermined path.

8. The carriage assembly of claim 7 wherein said pair of remote rollers include means for defining a recessed groove in the periphery thereof.

9. The carriage assembly of claim 3 further comprising
a loaded clamping roller positioned to movably engage said elongated mask support means for providing a clamping force which urges said elongated mask supporting means towards said central guide rollers to form an equivalent three point support and suspension for said elongated mask supporting means as it is transported along said predetermined path.

10. The carriage assembly of claim 2 wherein said elongated mask supporting means mask positioning means includes
an elongated mask supporting frame having
an upper surface and a lower surface and a pair of spaced, parallel generally elongated sidewalls extending along the periphery of the upper surface of said elongated mask supporting frame to define a mask supporting upper surface
means defining a plurality of apertures extending through the upper surface and lower surface of said elongated mask supporting frame wherein each aperture has a predetermined diameter and the elongated member positions a predetermined number of teeth between the centers thereof, each of said apertures being adapted to have a said mask positioned therein; and wherein said means for defining the guiding surface and the supporting surface include
a pair of spaced, parallel generally elongated support rails extending along the periphery of the lower surface of said elongated mask supporting frame and in opposed alignment with said elongated sidewalls.

11. The carriage assembly for claim 3 further comprising
gantry means for withdrawing and positioning a said substrate relative to said elongated mask supporting means as the same is supported by said support roller and each of said guide rollers, said gantry means being adapted to withdraw a said substrate from an accurate aligned position relative to a selected mask in a working area and to withdraw a said substrate away from said elongated mask supporting means a sufficient distance to enable said teeth on the elongated member and teeth on said rotatable driving member to move said elongated mask supporting means to index a different one of said apertures having a said mask therein and to reposition said gantry means and said substrate at termination of the indexing of said elongated mask supporting means in accurate alignment with a different selected mask of said plurality of masks.

12. A carriage assembly for positioning a selected mask from a plurality of masks adapted to be supported thereon between a substrate and a source comprising
an elongated mask supporting frame having an upper surface and a lower surface, a pair of spaced, parallel generally elongated sidewalls extending along the periphery of the upper surface of said elongated mask supporting frame to define a mask supporting upper surface and a pair of spaced, parallel generally elongated support rails extending along the periphery of the lower surface of said elongated mask supporting frame and in opposed alignment with said elongated sidewalls, said elongated mask supporting frame including means defining a plurality of apertures extending through the upper surface and lower surface thereof wherein each aperture has a predetermined diameter and a preselected spacing between the centers thereof, each of said apertures being adapted to have a said mask positioned therein;
a support roller having an outer cylindrical rail bearing surface and selected axial length for engaging and dynamically rotatably supporting one of said pair of rails as said elongated mask supporting frame is conveyed along a path which is substantially parallel to the direction of elongation thereto, said support roller rotating about an axis which is substantially normal to the direction of elongation of said elongated mask supporting frame; and
a pair of central guide rollers each of which have an outer grooved recessed rail receiving surface for engaging, guiding and dynamically supporting the other of said pair of rails as said elongated mask supporting frame is conveyed along a path which is substantially parallel to the direction of elongation of said elongated mask supporting frame, each of said central guide rollers rotating about an axis which is substantially normal to the direction of elongation of said elongated mask supporting frame and each of which is parallel to the axis of said support roller, each of said central guide rollers grooved recessed rail bearing surface being adapted to rotatably engage the other of said pair of rails to maintain the same in the recessed groove during conveyance of said elongated mask supporting frame.

13. The carriage assembly of claim 12 further comprising a loaded clamping roller having an outer cylindrical sidewall bearing surface for engaging and dynamically clamping the one sidewall opposite to said other of said pair of rails as said elongated mask supporting frame is conveyed along a path which is substantially parallel to the direction of elongation of said elongated mask supporting frame, said loaded clamping roller being adapted to rotate about an axis which is substantially normal to the direction of elongation of said elongated mask supporting frame and being spaced in parallel alignment with the axis of said central guide rollers and located above and intermediate the axis of each of said central guide rollers, said loaded clamping roller being spaced above the center of the recessed grooves formed in the periphery of each of said central guide rollers with said loaded clamping roller in moveable engagement with the edge of said one sidewall to hold said elongated mask supporting frame in fixed position within the said recessed groove and inhibit separation of the elongated mask supporting frame from the central guide roller during conveyance of said elongated mask supporting frame relative to said support rollers and guide rollers; and said support roller and said central guide rollers providing an equivalent three point suspension and support for said elongated mask supporting frame as the same is conveyed along the direction of its elongation and with said loaded clamping roller cooperating with said central guide rollers to hold the edge of said other of said pair of rails fixed within said recessed groove of each of said central guide rollers while enabling the edge of said one of said pair of rails to move laterally on the outer cylindrical bearing surface of the support roller during conveyance of said elongated mask supporting frame.

14. The carriage assembly of claim 12 further comprising a pair of remote guide rollers positioned one on each side of said central guide rollers and located along said path and having recessed grooves for engaging, guiding and dynamically supporting said elongated mask supporting frame when it is located at a position other than its centered position, said central guide rollers, one or the other of said remote guide rollers and said support roller cooperating with each other to form an equivalent three point support and suspension for said elongated mask supporting frame as it is transported along said path.

15. The carriage assembly of claim 12 wherein said elongated mask supporting frame includes a translatably supported tooth rack operatively coupled to said elongated mask supporting frame and havng a plurality of spaced teeth located along one edge thereof and substantially parallel to said predetermined path, said translatably supported tooth rack being formed of a material having a coefficient of thermal expansion along said line of reference substantially equal to the coefficient of thermal expansion of the material forming said elongated mask supporting frame to maintain the number of teeth between the center line of each mask, substantially the same independent of the amount of thermal expansion and contraction and distortion of the elongated mask supporting frame; and a rotatable driving member having a predetermined number of teeth formed around the periphery thereof and positioned to movably engage the teeth on said translatably supported tooth rack, said rotatable driving member and said translatably supported tooth rack being adapted to maintain driving engagement therebetween independent of the amount of thermal expansion and contraction and distortion of the elongated mask supporting frame and of said translateably supported tooth rack along said line of reference to enable a predetermined number of turns of said rotatable driving means to transport said support means a predetermined number of mask positions along said line of reference.

16. The carriage assembly of claim 15 wherein the translatably supported tooth rack has a preselected number of teeth between adjacent apertures and the number of teeth of the coupling gear is selected such that an integer number of revolutions or fraction of a revolution of the coupling gear transports the elongated mask supporting frame along its path a distance equal to the distance between the center lines of two adjacent apertures of the elongated mask supporting frame.

17. The carriage assembly for claim 15 further comprising gantry means for withdrawing and positioning a said substrate relative to said elongated mask supporting frame as the same is supported by said support roller and each of said guide rollers, said gantry means being adapted to withdraw a said substrate from an accurate aligned position relative to a selected mask in a working area and to withdraw a said substrate away from said elongated mask supporting frame a sufficient distance to enable said translatably supported tooth rack and said coupling gear to move said elongated mask supporting frame to index a different one of said apertures having a said mask therein and to reposition said gantry means and said substrate at termination of the indexing of said elongated mask supporting frame in accurate alignment with a different selected mask of said plurality of the masks.

18. The carriage assembly of claim 13 further comprising spring means operatively coupled to said loaded clamping rollers for urging said clamping rollers into contiguous engagement with said outer cylindrical sidewall bearing surface.

19. The carriage assembly of claim 13 further comprising a pair of remote guide rollers positioned one on each side of said central guide rollers and located along said path and having recessed grooves for engaging, guiding and dynamically supporting said elongated mask supporting frame when it is located at a position other than its centered position, at least one of the said central guide rollers, one of said remote guide rollers and said support roller cooperating with each other to form an equivalent three point support and suspension for said elongated mask supporting frame as it is transported along said path.

20. The carriage assembly of claim 15 wherein said rotatable driving member is located in opposed alignment to the position of a said mask indexed to a working station between a substrate and a source and on the lateral center line of a said working station to insure that the lateral center line of a said mask will be indexed substantially at the lateral center of a said working station regardless of the dimensional variation in length of the elongated mask supporting frame due to thermal expansion and contraction and distortion.

21. The carriage assembly of claim 20 wherein the axes of said central guide rollers are located one on each side of and equidistantly to the lateral central line of a said working station.

22. The carriage assembly of claim 21 wherein the axis of the support roller is located on the lateral central line of a said working station and in a spaced opposed position relative to said rotatable driving member.

* * * * *